United States Patent
Brown

(10) Patent No.: US 10,509,061 B2
(45) Date of Patent: Dec. 17, 2019

(54) METHOD AND SYSTEM FOR HIGH TEMPERATURE DETECTION IN ELECTRIC METERS

(71) Applicant: SENSUS SPECTRUM, LLC, Raleigh, NC (US)

(72) Inventor: Michael R. Brown, Mandeville, LA (US)

(73) Assignee: Sensus Spectrum, LLC, Raleigh, NC (US)

( * ) Notice: Subject to any disclaimer, the term of this patent is extended or adjusted under 35 U.S.C. 154(b) by 0 days.

(21) Appl. No.: 16/042,326

(22) Filed: Jul. 23, 2018

(65) Prior Publication Data

US 2019/0041439 A1 Feb. 7, 2019

Related U.S. Application Data

(60) Provisional application No. 62/541,214, filed on Aug. 4, 2017.

(51) Int. Cl.
G08B 21/00 (2006.01)
G01R 22/06 (2006.01)
G01D 3/08 (2006.01)
G01D 4/00 (2006.01)

(52) U.S. Cl.
CPC ............ *G01R 22/068* (2013.01); *G01D 3/08* (2013.01); *G01D 4/004* (2013.01); *G01R 22/063* (2013.01); *G01D 4/00* (2013.01)

(58) Field of Classification Search
CPC ...... G01R 22/068; G01R 22/063; G01D 3/08; G01D 4/004; G08B 21/00
See application file for complete search history.

(56) References Cited

U.S. PATENT DOCUMENTS

| | | | |
|---|---|---|---|
| 5,862,391 A | 1/1999 | Salas et al. | |
| 7,513,683 B2 * | 4/2009 | Sanderford | G01R 31/04 374/102 |
| 8,854,217 B2 | 10/2014 | Brown et al. | |
| 9,052,351 B2 | 6/2015 | Reed et al. | |
| 2008/0084216 A1 | 4/2008 | Sanderford et al. | |
| 2009/0109021 A1 * | 4/2009 | Paoletti | G01R 31/343 340/540 |
| 2010/0036624 A1 | 2/2010 | Martin et al. | |

(Continued)

FOREIGN PATENT DOCUMENTS

WO 2012044175 A1 4/2012

OTHER PUBLICATIONS

International Search Report and Written Opinion issued in counterpart PCT Application No. PCT/US2018/043229 dated Dec. 28, 2018 (eleven (11) pages).

(Continued)

*Primary Examiner* — Phung Nguyen
(74) *Attorney, Agent, or Firm* — Olive Law Group, PLLC

(57) ABSTRACT

A system (with corresponding methods) for responding to an electrical meter alarm. The system utilizes a processor at a meter or at a utility, and an alarm chronical encoded in memory of the processor. The alarm chronical includes an alarm level correlating to a degree of risk associated with a state of the meter, a time stamp including a date and a time of when the alarm level triggered, a meter identification, and performance data of the meter.

22 Claims, 4 Drawing Sheets

| Alarm State | Time | Meter Temp | °C Temp | Instantaneous Current | Cumulative Energy |
|---|---|---|---|---|---|
| Level 1 | 2:00 AM / 06-02-2020 | 25°C | 25°C | 10A | 9 kWh |
| Level 2 | 11:00 PM / 06-02-2020 | 30°C | 30°C | 20A | 8 kWh |
| Level 3 | 1:00 PM / 06-01-2020 | 40°C | 40°C | 35A | 7 kWh |
| Level 2 | 11:00 AM / 06-01-2020 | 30°C | 30°C | 35A | 6 kWh |
| Level 1 | 10:00 AM / 06-01-2020 | 25°C | 25°C | 35A | 5 kWh |

Meter XXX1

(56) References Cited

U.S. PATENT DOCUMENTS

| | | |
|---|---|---|
| 2010/0156632 A1* | 6/2010 | Hyland .................. G08B 25/08 |
| | | 340/540 |
| 2012/0299745 A1* | 11/2012 | LaFrance ............... G01D 4/004 |
| | | 340/870.02 |
| 2013/0342352 A1 | 12/2013 | Knoop |
| 2014/0058572 A1 | 2/2014 | Stein et al. |
| 2014/0077821 A1 | 3/2014 | Reed et al. |
| 2014/0225737 A1 | 8/2014 | Brown et al. |
| 2014/0266673 A1 | 9/2014 | Mello |
| 2015/0377949 A1 | 12/2015 | Ramirez |
| 2017/0016943 A1 | 1/2017 | Martin et al. |

OTHER PUBLICATIONS

Inventia, "Telemetry Module MT-10" user manual [online], version 1.46, Jun. 2010 [retrieved on Sep. 17, 2018]. Retrieved from the internet: . See pp. 12-160.

\* cited by examiner

| Alarm State | Time | Meter Temp | °C Temp | Instantaneous Current | Cumulative Energy |
|---|---|---|---|---|---|
| Level 1 | 2:00 AM / 06-02-2020 | 25°C | 25°C | 10A | 9 kWh |
| Level 2 | 11:00 PM / 06-02-2020 | 30°C | 30°C | 20A | 8 kWh |
| Level 3 | 1:00 PM / 06-01-2020 | 40°C | 40°C | 35A | 7 kWh |
| Level 2 | 11:00 AM / 06-01-2020 | 30°C | 30°C | 35A | 6 kWh |
| Level 1 | 10:00 AM / 06-01-2020 | 25°C | 25°C | 35A | 5 kWh |
| Meter XXX1 | | | | | |

*FIG. 1A*

| Alarm State | Time | Meter Temp | Outside Temp | Power |
|---|---|---|---|---|
| High | 1:00 PM / 06-01-2020 | 40°C | 30°C | 7 kW |
| Medium | 11:00 AM / 06-01-2020 | 30°C | 25°C | 6 kW |
| Low | 10:00 AM / 06-01-2020 | 25°C | 20°C | 5 kW |
| Meter XXX1 | | | | |

*FIG. 1B*

| Alarm State | Time of Alarm State Change | Meter Temp | Average Current (last 30 min) | Average Voltage (last 30 min) |
|---|---|---|---|---|
| Low | 1:00 PM / 06-01-2020 | 25°C | 10.5 A | 120 V |
| Medium | 11:00 AM / 06-01-2020 | 30°C | 20.7 A | 110 V |
| Low | 10:00 AM / 06-01-2020 | 25°C | 8.2 A | 120 V |
| Meter XXX1 | | | | |

*FIG. 2*

METHOD AND SYSTEM FOR HIGH TEMPERATURE DETECTION IN ELECTRIC METERS

CROSS REFERENCE TO RELATED APPLICATIONS

This application is related to and claims priority to U.S. Ser. No. 62/541,214, entitled "METHOD AND SYSTEM FOR HIGH TEMPERATURE DETECTION IN ELECTRIC METERS," filed Aug. 4, 2017, the entire contents of which are incorporated herein by reference.

BACKGROUND OF THE INVENTION

Field of the Invention

The present invention relates to a system and method for detecting a problem or deterioration in an electrical connection, and in particular, for assessing an electricity meter status under an alarm condition.

Description of the Related Art

Conventional electrical connections may deteriorate for a variety of reasons, such as aging, harsh treatment, removal and insertion of a meter or operation in poor environments. A deteriorated electrical connection may exhibit increased temperature prior to catastrophic failure of the electrical connection. For example, if an electrical connection is oxidized or corroded, or if a mechanical deterioration (e.g., reduced spring force in the meter socket jaws) results in poor connection between contacts in an electrical connection, a resistance of the electrical connection may increase. When the resistance of an electrical connection increases, power dissipation and a corresponding thermal temperature of the electrical connection may likewise increase.

Accordingly, by detecting an increase in a temperature of an electrical connection, a deterioration of the electrical connection may be detected, and a catastrophic failure of the electrical connection may be avoided or otherwise addressed.

U.S. Pat. No. 8,854,217 (the entire contents of which are incorporated herein by reference) describes a method and apparatus which monitored and controlled the operation of an electricity meter, and which modified a temperature threshold for determining when an alarm message should be transmitted or an electrical connection in the meter should be disconnected. The method and apparatus of the '217 patent included a plurality of sensors that detected temperatures in various locations within the electricity meter. The method and apparatus of the '217 patent determined an average rate of change for a temperature within the meter.

U.S. Pat. No. 9,052,351 (the entire contents of which are incorporated herein by reference) describes a method and apparatus that monitors and controls an operation of an electricity meter. The '351 patent detailed a potential failure condition of an electrical connection between an electricity meter and a meter socket in an electrical line that provides power from a power supply to an electrical load through the electricity meter. In the '351 patent, a correction time before failure was determined in order to decide whether the electricity meter was in an imminent failure condition.

SUMMARY OF THE INVENTION

In one embodiment, there is provided a system for responding to an electrical meter alarm. The system utilizes a processor at a meter or at a utility and an alarm chronical encoded in memory of the processor. The alarm chronical includes an alarm level correlating to a degree of risk associated with a state of the meter, a time stamp including a date and a time of when the alarm level triggered, a meter identification, and performance data of the meter.

In one embodiment, there is provided a method for responding to an electrical meter alarm. The method comprises receiving at a processor of a utility an alarm chronical including a) an alarm level correlating to a degree of risk associated with a state of the meter, b) a time stamp including a date and a time of when the alarm level triggered, c) a meter identification, and d) performance data of the meter. The method processes the alarm chronical and prioritizes work orders for responding to the alarm level.

In one embodiment, there is provided a method for posting an electrical meter alarm to a utility. This method comprises generating at a processor of a meter an alarm chronical including a) an alarm level correlating to a degree of risk associated with a state of the meter, b) a time stamp including a date and a time of when the alarm level triggered, c) a meter identification, and d) performance data of the meter. This method transmits the alarm chronical to a utility server such that the utility server is capable of prioritizing work orders for responding to the alarm level.

It is to be understood that both the foregoing general description of the invention and the following detailed description are exemplary, but are not restrictive of the invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawing, wherein:

FIG. 1A is a tabular depiction of a data log according to an embodiment of the invention;

FIG. 1B is a tabular depiction of another data log according to an embodiment of the invention;

FIG. 2 is a tabular depiction of a data log according to an embodiment of the invention;

DETAILED DESCRIPTION OF THE INVENTION

Figure 3:
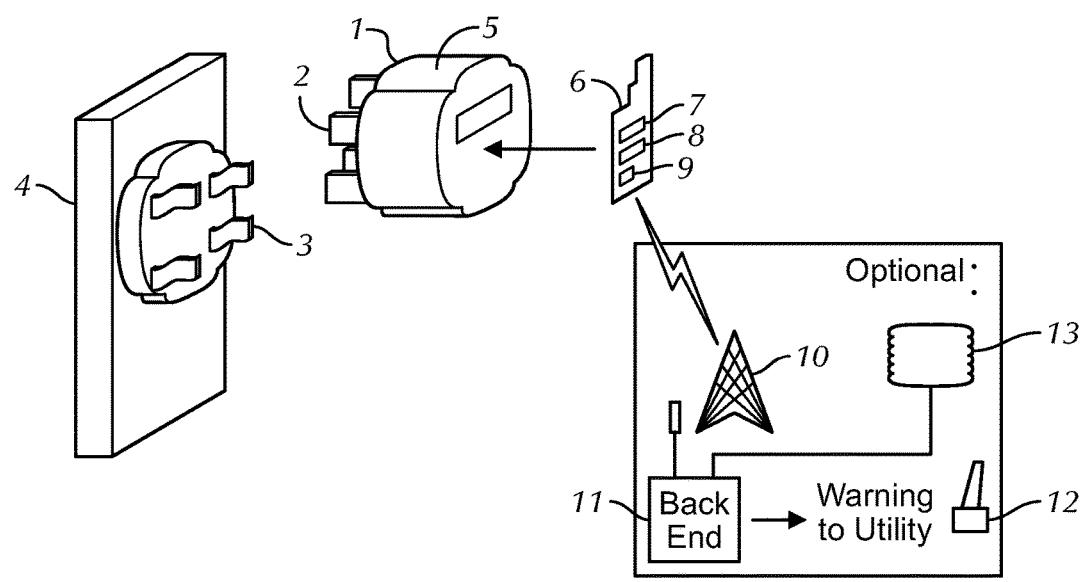
FIG. 3 is a block diagram of a data-logging meter according to an embodiment of the invention.

One problem that is faced by a utility is that, if many alarm messages are received from different meters about temperatures higher than a threshold, how does the utility determine which reports require immediate attention vs eventual attention vs no attention.

The invention pertains to high temperature detection in electric meters. In one aspect of the invention, when the electric meter detects a high temperature event (i.e., higher than a pre-programmed threshold), the meters sends a message to the utility in the form of a "TempCon" log. FIG. 1A is a table depicting exemplary elements of a TempCon log. FIG. 1B is a table depicting exemplary elements of another TempCon log.

In one embodiment, as shown in FIGS. 1A and 1B, a "TempCon" log provides alert state information such as for example a temperature status condition recorded over time. In one embodiment of the invention, the TempCon log includes alert state information. In a preferred embodiment, the alert state information contains graduated levels of alert conditions, ranging from low severity to high severity. For example, the TempCon log can include a date/time stamp record which stores to memory (in the meter) any change of state along with logging of other pertinent information, such as environmental factors and power loading.

In one embodiment of the invention, each TempCon state will have criteria for entering or exiting the state. The criteria will likely be linked to a continuously running monitoring of temperature sensor(s) and an algorithm which could be as simple as setting of temperature thresholds of a single temperature sensor or progressively more complex algorithms employing the use of multiple temperature sensors or relationships between sensors and mathematical applications on sensor data over time.

In one embodiment of the invention, the meter has a high temperature threshold setting. If the meter temperature exceeds the threshold, an alarm will be sent via the on-board radio. The simple algorithms may further divide the meter temperature range, for example, Level 1=−40° C. through 25° C., Level 2=26° C. through 45° C., Level 3=46° C. through 65° C., Level 4=66° C. through 85° C., Level 5 is greater than or equal to 85° C. More complex algorithms may take in account the thermal specifics of a meter for example, relationships of general internal temperature compared to busbar temperature or monitoring for evidence of sun loading as an input or rate of rise (slope) of a temperature or most likely, a combination of some or all of these.

FIG. 2 is another table depicting other exemplary elements of the TempCon log. In the embodiment shown in FIG. 2, each change of state of a TempCon state would trigger the logging of the date and time of the change of state, the value of each of the temperature sensors available in the system, and other pertinent information such as the instantaneous voltage and current sampled at the change of state time, the average voltage and average current over a window of time, etc.

When the utility receives an alarm message from a meter having an internal temperature higher than the threshold, the utility can query the meter for the TempCon log file and use the information contained therein to decide on the urgency of a field visit to the meter for repair.

The log file can contain information such as: Change of state to level X, Date of change, Time of change, Temperature reading 1, Temperature reading 2, Temperature reading 3, Instantaneous Current at time of change, Average Current at time of change, Average voltage at time of change, Instantaneous voltage at time of change, Cumulative energy reading at time of change, load side voltage, other pertinent meter data.

Details of an exemplary data-logging meter and an exemplary communication server are provided below. In the following discussion of the drawings, like reference numerals designate identical or corresponding parts throughout the several views.

FIG. 3 is a block diagram of an electricity meter 1 according to one embodiment of the present invention. The electricity meter 1 includes meter electrical contacts 2 that may be positioned to contact panel electrical contacts 3 on a meter power panel 4. The electricity meter 1 also includes an enclosure 5, which may include an insulating material such as glass or plastic. The electricity meter 1 includes a communications board 6 which can be located as shown inside the enclosure 5. The communications board 6 may include a communication circuit 7 for communication of information between the electricity meter 1 and a sensing station 10.

The sensing station can be, for example, a power line communications receiver located at a utility or sub-station, a drive-by vehicle outfitted with a radio receiver, a power pole mounted radio receiver capable of forwarding the meter information by any means to the utility, or a multiplicity of transceivers capable of forwarding information to a collation points (such as a mesh). Further, the communication board 6 may include a controller 8 configured to control an operation of the electricity meter 1 and a temperature sensor 9 configured to detect temperature information. The controller 8 may receive temperature information from the temperature sensor 9 and control the sending of the temperature information to the sensing station 10 via the communication circuit 7. The temperature sensors provided can be in and around meter 1. In addition, separate stand-alone temperature sensing units, including thermistors, thermocouples, or infra-red sensing devices may be mounted on interior portions of an enclosure, or to other components in a vicinity of meter 1. For example, one or more temperature sensors may be placed on or near meter power panel 4.

The sensing station 10 may be coupled via a communications networks (e.g., a wireless radio network, an optical network, a Power Line Carrier, a wired network, etc. . . . ) to a back end 11 that is in communication with other similarly equipped electricity meters and is also in communication with a utility provider 12, such as a utility company, both referred to herein as the "utility." Temperature information may be sent to the utility 12 which can use the information to track failure rates, detect possible deterioration, or initiate maintenance.

Further, utility 12 may send control information to the electricity meter 1 based on the received temperature information. For example, the control information may include new predetermined temperature thresholds, changes to an algorithm operating in the controller 8, or to provide other information used by the controller 8.

In an alternative embodiment, the controller 8 may communicate with the utility 12 via an intermediate device (not show) configured to operate as an intermediate relay point. The back-end 11 or the utility 12 may contain a processor and software that can collect the messages from the monitored meters. The processor can utilize the temperature information from the meter to determine when an alarm should be passed to a utility. Alarm determination algorithms may include: temperature exceeds a predetermined fixed temperature, or temperature increases at a rate greater than a predetermined "rate of rise" degrees/minute, or present temperature exceeds an average temperature by a predetermined percentage, etc.

Further, controller 8 may be configured to transmit temperature information to the sensing station 10 at a regular rate, for example, every 10 minutes or every 4 hours. Alternatively or additionally, the controller 8 may be configured to transmit the temperature information when predetermined temperature conditions occur (e.g., temperature exceeds a predetermined fixed temperature, or temperature increases at a rate greater than a predetermined "rate of rise" degrees/minute, or present temperature exceeds an average temperature by a predetermined percentage, etc. . . . ), or when a particular action occurs (e.g., turn-on/off in sensed power is detected, or communication signal requesting temperature (e.g., a polling message or wake up message) is received, etc. . . . ). This type of information which triggered the communication may in one embodiment of the invention be included in the TempCon log file transmitted to utility 12. Since the criteria for entering or exiting a state will be specific to a meter based on the mechanics of the meter, the criteria used in the decision to change state can also be included in the log in part or in whole.

Further, in alternative embodiments, the temperature sensor 9 may be mounted on a mass that is in thermal proximity with the electrical connection. For example, the temperature sensor 9 may be mounted elsewhere inside or outside the enclosure, or may be located separate from the enclosure, and the temperature sensor 9 may include a communication interface provided between the temperature sensor 9 and the controller 8. This type of information can be included in the TempCon log file transmitted to utility 12.

The processor of back-end 11 or utility 12 may be connected to a city-wide source of temperature information, such as local weather station or internet web site 13. The processor of back-end 11 or utility 12 can use this local temperature information to adjust up the alarm level on a hot day, or adjust down the alarm level on a cold day. Different thresholds or criteria for different meters can be logged and accounted for. In addition, the processor of back-end 11 ( ) can adjust the alarm level based on a material used in the meter enclosure (e.g., whether the meter housing, enclosure, or cover is made of glass or plastic). These alternatives may compensate for the thermal resistance of the meter enclosure and for the differential temperature with outdoor ambient which both may affect the "normal range" temperature, which may be measured by the temperature sensor 9. Accordingly, the processor at the back-end 11 or the utility 12 can look at an average temperature for other meters operating under similar environmental and power loading conditions. This type of information can be included in the TempCon log file transmitted to utility 12.

Figure 4:
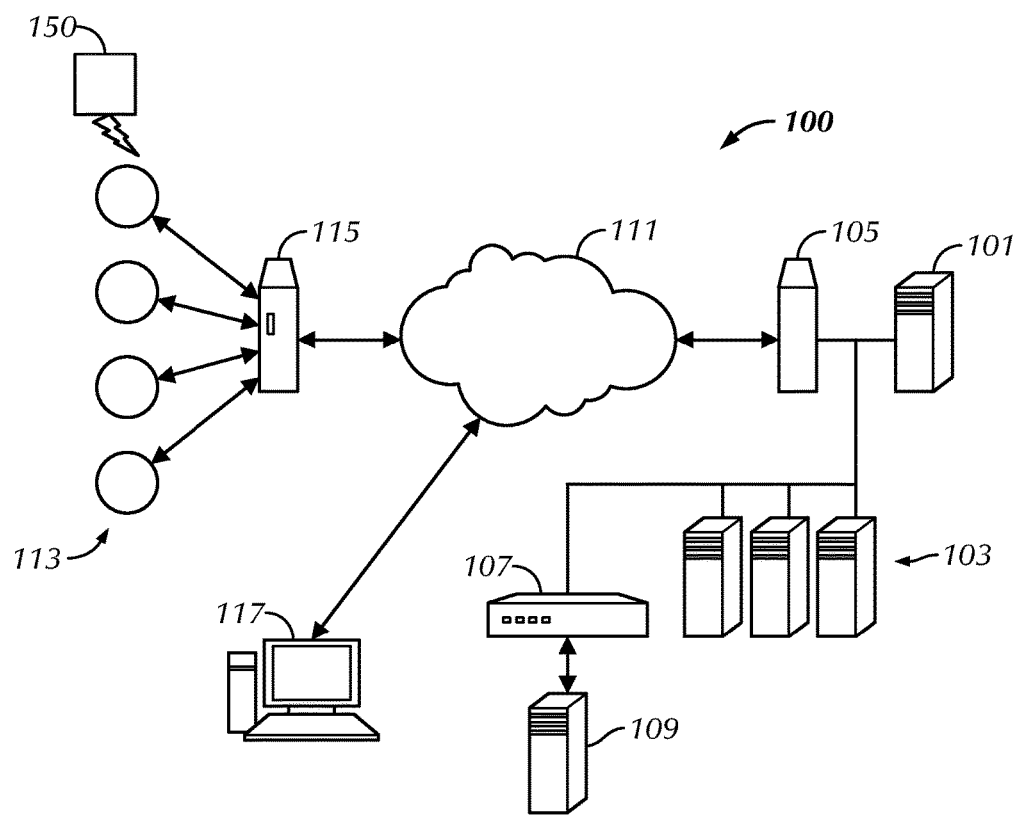
FIG. 4 is a block diagram of communications server according to an embodiment of the invention.

In accordance with the invention, FIG. 4 depicts a communication system 100 by which for example the meters in FIG. 3 can communicate to a utility server 101. Utility server 101 can be coupled to a data center 103 that includes databases where the meter-acquired data or the externally acquired data can be stored and optionally time-stamped.

Server 101 may be coupled via a firewall 105 to a computer network that is depicted in FIG. 4 as Internet 111 which communicates to utility meters 113. System 100 can also utilize protective firewalls 107 for protecting a utility company's virtual private network 109. Bi-directional communication may occur between each utility meter 113 and system 100 via point of presence (POP) 115. In addition, Internet communication devices such as personal computer 117 may access meters 113 and system 100.

The hardware design is not limiting of this invention, and may comprise a controller with program memory, a liquid crystal display or other known displays; a directional sensing infra-red disk interface, an infrared data association (IrDA) communications port for diagnostics; non-volatile memory for data reading/storage; a real-time clock for time stamping of data measurements; and a serial port to interface with various wired or wireless communication modules. Controller 115 may include one or more processors or equivalents thereof, such as a central processing unit (CPU) and/or at least one application specific processor (ASP). A processor may include one or more circuits or be a circuit that utilizes a computer readable medium, such as a memory circuit (e.g., ROM, EPROM, EEPROM, flash memory, static memory, DRAM, SDRAM, and their equivalents), configured to control the processor to perform and/or control the processes and systems of this disclosure. The processor can be a separate device or a single processing mechanism. The computer readable medium can include the methods and algorithms discussed therein as well as the TempCon log files.

Time of Use (TOU) demand metering as well as flat rate metering; records usage in predefined intervals, data storage allotments are programmable, and the meters can send information to utility server 101. The meter or the utility server 101 can access one or more internet service providers to enhance communication reliability through redundancy. The meter software establishes an Internet connection to the portal server that, in turn, executes a set of procedures to validate each transaction from the meter to utility server 101 before transmitting data. Data integrity and duplication checks may be performed in a validation process. The software can manage field upgrades through the Internet; offers event notification of hardware failure, power up, power outage and tamper/theft detection with notification capabilities; offers diagnostics of event, connect and diagnostics logs.

Each utility meter 113 is capable of measuring energy consumption in real time. Electrical usage readings are taken at programmed predetermined intervals and can be stored in a non-volatile memory at the meter 113 or the utility server 101. Each meter 113 can periodically establish a link to system 100. Each utility meter 113 can have an identification number assigned to it.

Each meter 113 may take electricity usage data in predetermined intervals that are determined by embedded software in the meter 113. The predetermined intervals may be pre-selected at 5, 10, 15, 30, or 60 minutes. The usage is calculated in accordance with predetermined quantifications or "buckets" of total power consumed, power consumed in peak times, power consumed in off-peak times; and power consumed during peak/off-peak shoulder periods. This type of information can be included in the TempCon log file transmitted to utility 12.

As noted above, temperature sensors are provided in and around the electricity meters. Look up tables can be used to determine reference rates of change in temperature, can be updated dynamically in response to the detection of operating parameters of an electricity meter, or external conditions that may dictate different permissible rates at which temperature can change. The updates can be provided through a network communication or through onsite maintenance of the electricity meter 100.

The systems shown in FIGS. 3 and 4 can be used to provide the above-noted "TempCon" logs provide alert state information to the utility.

In one embodiment of the invention, the utility server determines a set of rules for attending to meter alarms occurring in the field based on the data received from the TempCon logs. In one embodiment of the invention, the utility server responds to meter alarms based on knowledge of what is expected to happen as environmental factors in the day evolve. In one embodiment of the invention, the utility inspects archived records showing tendencies and trends for similar environmental and power load conditions. In one embodiment of the invention, the utility inspects archived records showing tendencies and trends of a specific meter for evidence of a worsening condition.

In one embodiment of the invention, the format of data delivered to the utility server from the meter is in a standardized format which the utility is programmed to receive. In one embodiment of the invention, the utility server receiving the standardized format, reads the data and archives the data for future reference. In one embodiment of invention, the standardized format includes the temperature readings from an individual meter along with data on environmental factors and readings of the power loads at the meter at the time of the temperature readings.

In one environment invention, the utility decides to issue a work order for meters that are under an alarm state and which are determined from either the standard operating conditions (for similar meters in the field at the same time operating under similar conditions or from archived operating conditions of meters in the field operating under similar conditions) or from a worsening trend of a specific meter, if service of the meter is required. The utility server can also determine how soon the service should be sent. In one embodiment of the invention, work orders are then scheduled according to the timelines established by the utility server.

The advantages of this approach are as follows.

Prior to this invention, utilities were at a disadvantage in the knowing how to respond to alarm conditions. With the present invention, the utility can establish a uniform response policy based on the data received from the meters in the field. This uniform response policy may further be a modified by input from service people in the field as the service people attend to a particular meter alarm. In this way, the response policy of the utility becomes a "smart" policy (protocol) which learns from the power loads, the environment factors, and the archived history and then decides which alarms to attend to immediately.

In the present invention, the utility server collects information from the individual meters as the information is transmitted to the utility server. This information is then processed by the utility server to decide if an actual alarm needs an immediate response or if the alarm is the type that can be postponed and not attended to at the moment. The utility server is able to use a rules-base to decide if the alarms are beyond the standard operating conditions (defined herein as the conditions of other meters operating under similar environmental conditions and power loads). In one embodiment of the invention, the utility decides how to rank the service requirements based on the data it receives.

During the course of a day, the temperatures for example inside a meter change depending on the environmental conditions outside of the meter. During the course of the day, the temperatures for example inside a meter change depending on the actual resistive power of being dissipated by the meter from the power being transferred into a household for example. During the course of a day, weather events such as rain storms and snow storms can also provide cooling to the outside housing in the meters. These external factors mean that, depending on standard operating conditions (defined as above with relation to other meters in the field) internal operating temperature during a cold winter day may not be as critical as the same operating temperatures on a hot summer day.

Furthermore, the utility server can check records for similar responses from temperature sensors (at the same meter or different meters) under similar external conditions and under similar power loads. This archiving and cross-checking in one embodiment invention allows the utility server to make prudent judgements on whether the alarm conditions being seen at a meter or at a group of meters are the alarm condition switch need immediate attention or if they are alarm conditions within the norm.

Figure 5:
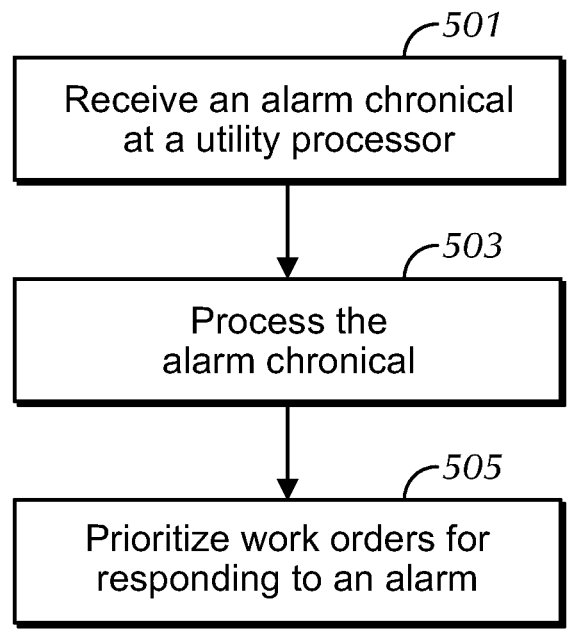
FIG. 5 is a flowchart depicting a method of the invention which responds to an electrical meter alarm.

Accordingly, in one embodiment of the invention, there is a method which responds to an electrical meter alarm. FIG. 5 is a flowchart depicting this method At step 501, at a processor of a utility (for example utility 12) receives an alarm chronical including a) an alarm level correlating to or indicating a degree of risk associated with a state of the meter, b) a time stamp including a date and a time of when the alarm level triggered, c) a meter identification, and d) performance data of the meter. The alarm chronical can include any or all of the temperature and historical performance data noted above. The method processes the alarm chronical at step 503, and prioritizes work orders for responding to the alarm level at step 505.

Figure 6:
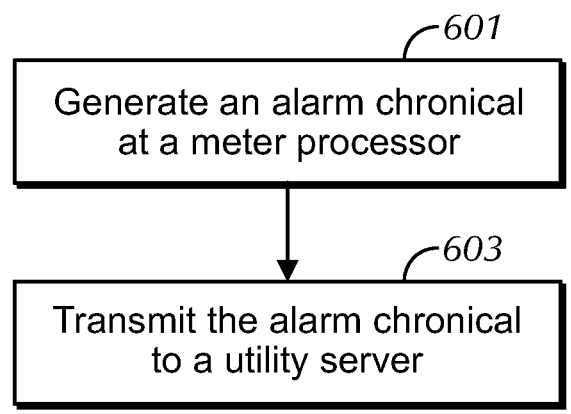
FIG. 6 is a flowchart depicting a method of the invention which posts an electrical meter alarm to a utility.

Accordingly, in one embodiment of the invention, there is a method which posts an electrical meter alarm to a utility. FIG. 6 is a flowchart depicting this method.

At step 601, this method comprises generating at a processor of a meter a data set including a) an alarm level correlating to or indicating a degree of risk associated with a state of the meter, b) a time stamp including a date and a time of when the alarm level triggered, c) a meter identification, and d) performance data of the meter. This method transmits the data set to a utility serve such that the utility server is capable of prioritizing work orders for responding to the alarm level.

Numerous modifications and variations of the present invention are possible in light of the above teachings. It is therefore to be understood that within the scope of the appended claims, the invention may be practiced otherwise than as specifically described herein.

The invention claimed is:

1. A system for responding to an electrical meter alarm, comprising:
   a processor at a meter or at a utility;
   an alarm chronical encoded in memory of the processor, the alarm chronical comprising,
      an alarm level correlating to a degree of risk associated with a state of the meter,
      a time stamp including a date and a time of when the alarm level triggered,
      a meter identification, and
      performance data of the meter,
   wherein the degree of risk is correlated by cross-checking records at the utility for meters operating under similar external conditions and under similar power loads.

2. The system of claim 1, wherein the alarm level comprises a hierarchical set of alarms.

3. The system of claim 2, wherein the time stamp denotes a change of the state of the meter from a first alarm to a second alarm of the hierarchical set of alarms.

4. The system of claim 2, wherein the change of the state comprises an increased degree of the risk.

5. The system of claim 2, wherein the change of the state comprises a decreased degree of the risk.

6. The system of claim 1, wherein the alarm level comprises a priority ranking designating that the meter requires immediate attention.

7. The system of claim 1, wherein the alarm level comprises a non-priority ranking designating that the meter requires no attention.

8. The system of claim 1, wherein the performance data includes environmental information.

9. The system of claim 8, wherein the environmental information includes temperature and precipitation data.

10. The system of claim 1, wherein the performance data includes electrical data related to electricity consumption at the meter.

11. The system of claim 10, wherein the electrical data includes at least one of instantaneous power, instantaneous voltage, and instantaneous current.

12. The system of claim 10, wherein the electrical data includes at least one of time-averaged power, time-averaged instantaneous voltage, and time-averaged current.

13. The system of claim 1, wherein the performance data includes temperature data of the meter.

14. The system of claim 13, wherein the temperature data includes instantaneous or time-averaged temperatures of the meter.

15. The system of claim 1, wherein the processor is capable of communication with other meters operating under similar field conditions as the meter.

16. The system of claim 1, wherein the processor is capable of inspecting archived data in order to query for meter temperatures operating under similar field conditions as the meter.

17. The system of claim 1, wherein the processor comprises a utility processor programmed to receive from a plurality of meters a standardized data log of the alarm chronical.

18. The system of claim 17, wherein the utility processor is programmed with a set of rules interpreting the alarm level based on the performance data in order to establish a priority for work orders responding to the alarm level.

19. The system of claim 17, wherein the utility processor is programmed with a set of rules interpreting the alarm level based on the performance data including at least one of an instantaneous temperature or a time-averaged temperature of the meter in order to establish a priority for work orders responding to the alarm level.

20. The system of claim 17, wherein the utility processor is programmed with a set of rules interpreting the alarm level based on the performance data.

21. A method for responding to an electrical meter alarm, comprising:
   receiving at a processor of a utility an alarm chronical including a) an alarm level correlating to a degree of risk associated with a state of a meter, b) a time stamp including a date and a time of when the alarm level triggered, c) a meter identification, and d) performance data of the meter;
   correlating the degree of risk by cross-checking records at the utility for meters operating under similar external conditions and under similar power loads; and
   processing the alarm chronical and prioritizing work orders for responding to the alarm level.

22. A method for posting an electrical meter alarm to a utility, comprising:
   generating at a processor of a meter an alarm chronical including a) an alarm level correlating to a degree of risk associated with a state of the meter, b) a time stamp including a date and a time of when the alarm level triggered, c) a meter identification, and d) performance data of the meter;
   correlating the degree of risk by cross-checking records at the utility for meters operating under similar external conditions and under similar power loads; and
   transmitting the alarm chronical to a utility server such that the utility server is capable of prioritizing work orders for responding to the alarm level.

* * * * *